US008390056B2

United States Patent
Lu et al.

(10) Patent No.: US 8,390,056 B2
(45) Date of Patent: Mar. 5, 2013

(54) NON-VOLATILE SEMICONDUCTOR MEMORY DEVICE WITH INTRINSIC CHARGE TRAPPING LAYER

(75) Inventors: Hau-Yan Lu, Kaohsiung (TW); Shih-Chen Wang, Taipei (TW); Ching-Sung Yang, Hsinchu (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/253,083

(22) Filed: Oct. 5, 2011

(65) Prior Publication Data

US 2012/0018794 A1 Jan. 26, 2012

Related U.S. Application Data

(62) Division of application No. 12/633,780, filed on Dec. 8, 2009, now Pat. No. 8,174,063.

(60) Provisional application No. 61/230,099, filed on Jul. 30, 2009.

(51) Int. Cl.
*H01L 29/788* (2006.01)
(52) U.S. Cl. .. 257/324; 257/314; 257/315; 257/E27.103
(58) Field of Classification Search .......... 257/257–265, 257/314–316, 324, E27.103, E29.309
See application file for complete search history.

(56) References Cited

U.S. PATENT DOCUMENTS

| | | | |
|---|---|---|---|
| 6,828,618 B2 * | 12/2004 | Baker et al. | 257/311 |
| 7,227,234 B2 | 6/2007 | Roizin | |
| 7,294,888 B1 | 11/2007 | Paak | |
| 7,456,465 B2 | 11/2008 | Prinz | |
| 7,811,886 B2 | 10/2010 | Winstead | |
| 7,915,666 B2 * | 3/2011 | Yasui et al. | 257/324 |
| 8,174,063 B2 | 5/2012 | Lu | |
| 2006/0008983 A1 * | 1/2006 | Yeh | 438/257 |
| 2006/0008992 A1 | 1/2006 | Shukuri | |
| 2006/0028868 A1 | 2/2006 | Okazaki | |
| 2006/0076607 A1 | 4/2006 | Kang | |
| 2008/0188052 A1 | 8/2008 | Winstead | |
| 2009/0134449 A1 | 5/2009 | Arigane | |
| 2010/0244120 A1 | 9/2010 | Kang | |
| 2011/0024823 A1 | 2/2011 | Lu | |
| 2011/0221472 A1 * | 9/2011 | Wang | 326/49 |
| 2012/0163072 A1 | 6/2012 | Lu | |

* cited by examiner

*Primary Examiner* — Thanh Nguyen
(74) *Attorney, Agent, or Firm* — Winston Hsu; Scott Margo

(57) ABSTRACT

A non-volatile semiconductor memory device includes a substrate, a first gate formed on a first region of a surface of the substrate, a second gate formed on a second region of the surface of the substrate, a charge storage layer filled between the first gate and the second gate, a first diffusion region formed on a first side of the charge storage layer, and a second diffusion region formed opposite the charge storage layer from the first diffusion region. The first region and the second region are separated by a distance sufficient for forming a self-aligning charge storage layer therebetween.

6 Claims, 8 Drawing Sheets

NON-VOLATILE SEMICONDUCTOR MEMORY DEVICE WITH INTRINSIC CHARGE TRAPPING LAYER

CROSS REFERENCE TO RELATED APPLICATIONS

This application is a division of application Ser. No. 12/633,780, filed on Dec. 8, 2009, which claims the benefit of U.S. Provisional Application No. 61/230,099, filed on Jul. 30, 2009 and entitled "Semiconductor Non-volatile Memory," the contents of all of which are incorporated herein by reference.

BACKGROUND OF THE INVENTION

1. Field of the Invention

The present invention relates to semiconductor non-volatile memory, and more particularly to a non-volatile semiconductor memory device having a charge storage layer.

2. Description of the Prior Art

Non-volatile memory is a type of memory that retains information it stores even when no power is supplied to memory blocks thereof. Some examples include magnetic devices, optical discs, flash memory, and other semiconductor-based memory topologies. Some forms of non-volatile memory have bits defined in fabrication, some may be programmed only once (one time programmable ROM, OTP ROM), and other types may be programmed and reprogrammed many times over. As semiconductor memory technologies have matured, one advantage that has come out of development of such technologies is the ability to integrate substantial amounts of memory cells in integrate circuits (ICs). However, it is desirable that the memory cells be formed in the same process with the ICs.

One goal of non-volatile memory devices is to fit increasing numbers of memory cells in smaller chip areas while utilizing the same fabrication process as other complementary metal-oxide-semiconductor (CMOS) devices in the IC. One method for increasing the number of memory cells utilizes "charge storage structures" to form 2-bit non-volatile semiconductor memory transistors. Please refer to FIG. 1, which is a diagram of a semiconductor memory transistor 100 according to the prior art. The semiconductor memory transistor 100 is formed on a substrate, which has two implanted source/drain regions 157-1 and 157-2 and a channel region 156. The channel region 156 and the implanted source/drain regions 157-1, 157-2 are formed under a gate region 152, and two charge storage structures 155-1 and 155-2 formed on either side of the gate region 152. The charge storage structures 155-1, 155-2 are made of a spacer material that has charge trapping properties, e.g. silicon-nitride or a high-k dielectric. The charge storage structure 155-2 is programmed by applying a gate voltage VG of 5 Volts and a drain voltage V2 of 5 Volts, with a source voltage V1 of 0 Volts. Thus, channel hot electrons from the source region 157-1 may enter the charge storage region 155-2 by traveling through the channel region 156. To erase the charge storage structure 155-2, a gate voltage VG of −5 Volts and a drain voltage V2 of −5 Volts may be applied, inducing band-to-band tunneling holes to enter the charge storage structure 155-2.

Another technique for providing a CMOS non-volatile memory cell that is fabricated using standard CMOS processes is shown in FIG. 2, which is a diagram of a CMOS non-volatile memory cell 200 ("memory cell 200" hereinafter) according to the prior art. The memory cell 200 is fabricated on a substrate 202, has two source/drain regions 204-1 and 204-2, and two poly gates 206-1 and 206-2 separated from the substrate 202 by gate dielectric layers 208-1 and 208-2, respectively. The gate dielectric layers 208-1/208-2 are formed of oxide-nitride-oxide (ONO) material. A programming layer 210 is formed between the two poly gates 206-1, 206-2, and is isolated from the two poly gates 206-1, 206-2 by an isolating layer 212. The programming layer 210 provides charge storage similar to a silicon-oxide-nitride-oxide-silicon (SONOS) structure utilized in flash memory cells. However, in the CMOS non-volatile memory cell 200, the two poly gates 206-1, 206-2 are utilized to program the programming layer 210. Silicon-nitride sidewall spacers 214-1 and 214-2 are deposited with the programming layer 210 for controlling e-field fringing near the source/drain regions 204-1, 204-2. Sidewall isolating layers 216-1 and 216-2 are grown with the isolating layer 212, and isolate the SiN sidewall spacers 214-1, 214-2 from the poly gates 206-1, 206-2 and the substrate 202. Second sidewall spacers 218-1, 218-2 are formed from silicon oxide. The programming layer 210 is programmed by grounding the poly gate 206-1, and leaving the source/drain regions 204-1, 204-2 and substrate 202 floating. A high voltage is applied to the poly gate 206-2 to attract electrons from the poly gate 206-1 into the programming layer 210 through the isolating layer 212. The negative charge of the programming layer 210 over the channel causes a negative bias, increasing threshold voltage of the memory cell 200 relative to non-programmed transistors in the same circuit.

Many various topologies are provided in the prior art for forming memory cells with charge storage layers. However, the memory cells are slow and inefficient.

SUMMARY OF THE INVENTION

According to an embodiment of the present invention, a non-volatile semiconductor memory device comprises a substrate of a first conductivity type comprising an active region, a select gate, a first gate, a second gate, a charge storage layer filled between the first gate and the second gate, a first diffusion region, and a second diffusion region. The select gate is formed fully on the active region. The first gate is formed partially on the active region on a side of the select gate, and is separated from the select gate by a first distance. The second gate is formed partially on the active region on the side of the select gate. The select gate and the second gate are separated by the first distance, and the first gate and the second gate are separated by a second distance. The charge storage layer is formed on a surface of the active region, fills between the first gate and the second gate, and further between the select gate, the first gate and the second gate. The first diffusion region is of a second conductivity type opposite the first conductivity type, and is formed on the surface of the active region on a first side of the charge storage layer opposite the select gate from the charge storage layer. The second diffusion region is of the second conductivity type, and is formed on the surface of the active region on a second side of the charge storage layer opposite the charge storage layer from the first side.

According to an embodiment of the present invention, a non-volatile memory string comprises a substrate of a first conductivity type comprising an active region, a select gate formed fully on the active region, a first diffusion region formed on the surface of the active region on a first side of the select gate, and at least one memory unit formed on a second side of the select gate opposite the first side. The first diffusion region is of a second conductivity type opposite the first conductivity type. Each memory unit comprises a first gate formed partially on the active region on the second side of the select gate, a second gate formed partially on the active region on the second side of the select gate, a charge storage layer formed on a surface of the active region filled between the first gate and the second gate, a second diffusion region of the second conductivity type formed on the surface of the active region on the first side of the charge storage layer, and a third diffusion region of the second conductivity type formed on the surface of the active region on the second side of the charge storage layer. The first gate and a second gate of a first memory unit of the at least one memory unit are separated from the select gate by a first distance, and are separated from each other by a second distance in a direction perpendicular to the first distance. First and second gates of each successive memory unit of the at least one memory unit after the first memory unit are separated from a first gate and a second gate of a previous memory unit by the first distance, and are separated from each other by a second distance in the direction perpendicular to the first distance. A second diffusion region of each successive memory unit of the at least one memory unit is a third diffusion region of the previous memory unit.

According to an embodiment of the present invention, a non-volatile memory array comprises a substrate of a first conductivity type comprising a plurality of active regions, and a plurality of memory strings. Each memory string of the plurality of memory strings comprises a select gate formed fully on one active region of the plurality of active regions, a first diffusion region of a second conductivity type opposite the first conductivity type formed on the surface of the active region on a first side of the select gate, and at least one memory unit formed on a second side of the select gate opposite the first side. Each memory unit comprises a first gate formed partially on the active region on the second side of the select gate, a second gate formed partially on the active region on the second side of the select gate, a charge storage layer formed on a surface of the active region filled between the first gate and the second gate, a second diffusion region of the second conductivity type formed on the surface of the active region on the first side of the charge storage layer, and a third diffusion region of the second conductivity type formed on the surface of the active region on the second side of the charge storage layer. A first gate and a second gate of a first memory unit of the at least one memory unit are separated from the select gate by a first distance, and are separated from each other by a second distance in a direction perpendicular to the first distance. First and second gates of each successive memory unit of the at least one memory unit after the first memory unit are separated from a first gate and a second gate of a previous memory unit by the first distance, and from each other by a second distance in the direction perpendicular to the first distance. A second diffusion region of each successive memory unit of the at least one memory unit is a third diffusion region of the previous memory unit.

According to an embodiment of the present invention, a non-volatile memory array comprises a substrate of a first conductivity type, a plurality of active regions on the substrate, and a plurality of memory cells, each memory cell formed on one active region of the plurality of active regions. Each memory cell comprises a select gate formed fully on the one active region, a first gate formed partially on the active region on a first side of the select gate, a second gate formed partially on the one active region on the first side of the select gate, a charge storage layer formed between the first gate and the second gate, a first diffusion region of a second conductivity type opposite the first conductivity type formed on the surface of the active region, a second diffusion region of the second conductivity type opposite the first conductivity type formed on the surface of the active region, and a third diffusion region of the second conductivity type opposite the first conductivity type formed on the surface of the active region between the select gate and the first gate, the charge storage layer, and the second gate. The select gate and the first gate are separated by a first distance. The second gate and the select gate are separated by the first distance. The first gate and the second gate are separated by a second distance. The first diffusion region and the second gate are formed on opposite sides of the select gate. The second diffusion region and the first gate are formed on opposite sides of the second gate. First diffusion regions of the plurality of memory cells are electrically connected to each other, and second diffusion regions of the plurality of memory cells are electrically connected to each other.

These and other objectives of the present invention will no doubt become obvious to those of ordinary skill in the art after reading the following detailed description of the preferred embodiment that is illustrated in the various figures and drawings.

DETAILED DESCRIPTION

Please refer to FIG. 3, which is a diagram of a complimentary metal-oxide-semiconductor (CMOS) non-volatile memory cell 300 (hereinafter "the memory cell 300") according to one embodiment of the present invention. The memory cell 300 may be formed over an active region 315 in a P-well region 310 of a substrate. Although P-well topology CMOS is described, the embodiments described herein are also suitable for application to N-well topology CMOS. A first N+ diffusion region 311-1 may be formed under a first polysilicon gate 313-1, and a second N+ diffusion region may be formed under a second polysilicon gate 313-2 and a third polysilicon gate 313-3.

The second polysilicon gate 313-2 and the third polysilicon gate 313-3 may be formed a first distance apart from each other. Further, the second polysilicon gate 313-2 and the third polysilicon gate 313-3 may both be formed a second distance apart from the first polysilicon gate 313-1. The first distance and the second distance may be of sizes suitable for forming self-aligning nitride (SAN) layers in a space between the first, second, and third polysilicon gates 313-1, 313-2, 313-3. For example, in a 90 nm/65 nm node, a range of 20 nm to 200 nm of separation between the first polysilicon gate 313-1 and the second and third polysilicon gates 313-2, 313-3, as well as between the second polysilicon gate 313-2 and the third polysilicon gate 313-3, may allow formation of a charge storage layer 314, e.g. a SAN layer, in the space between the first, second, and third polysilicon gates 313-1, 313-2, 313-3. Contacts 316-1 and 316-2 may be formed in the active region 315 over the diffusion regions 311-1 and 311-2, respectively, for charging the diffusion regions 311-1, 311-2 with voltage signals applied to the contacts 316-1, 316-2. A lightly-doped drain (LDD) block region may also be formed in and surrounding a region of the substrate over which the first, second, and third polysilicon gates 313-1, 313-2, 313-3 and the SAN layer 314 are formed.

Figure 1:
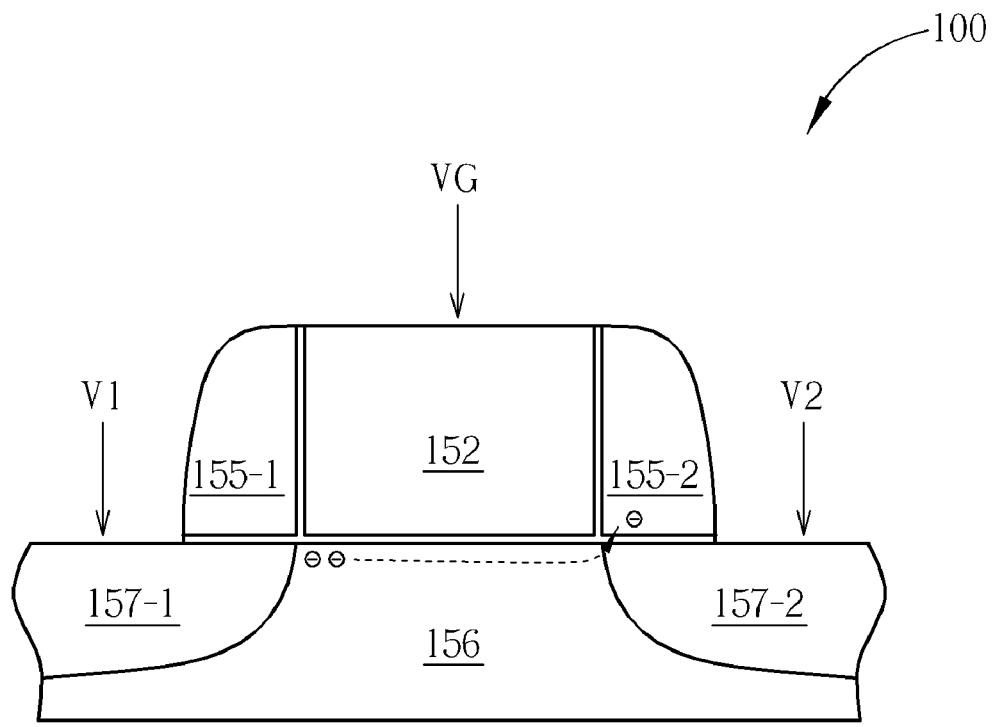
FIG. 1 is a diagram of a semiconductor memory transistor according to the prior art.
Figure 2:
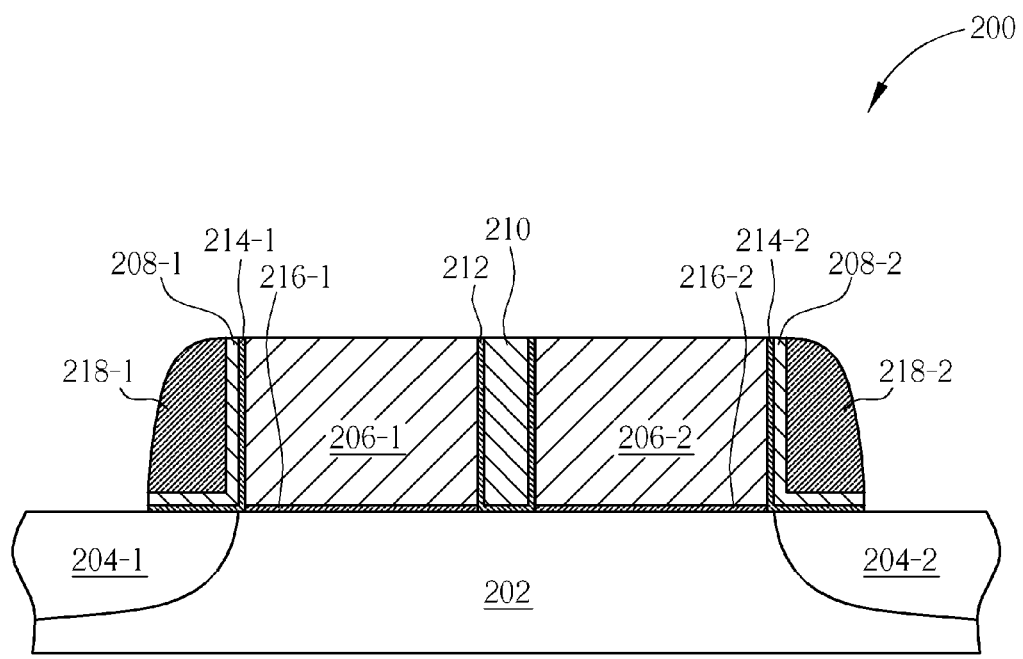
FIG. 2 is a diagram of a CMOS non-volatile memory cell according to the prior art.
Figure 3:
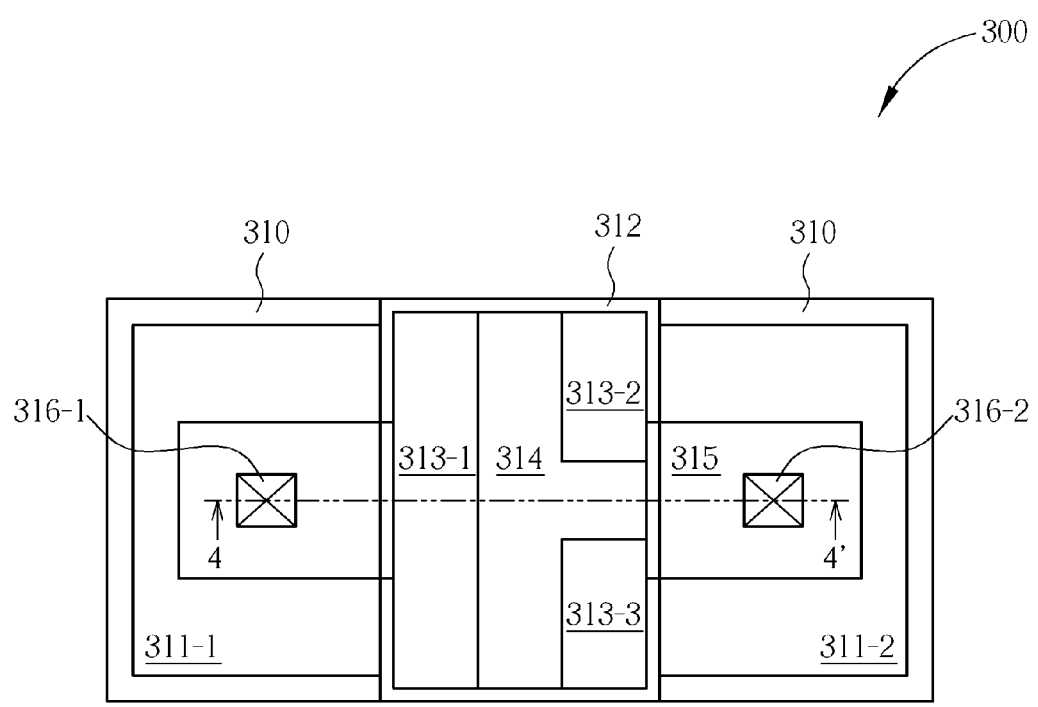
FIG. 3 is a diagram of a complimentary metal-oxide-semiconductor non-volatile memory cell according to one embodiment of the present invention.
Figure 4:
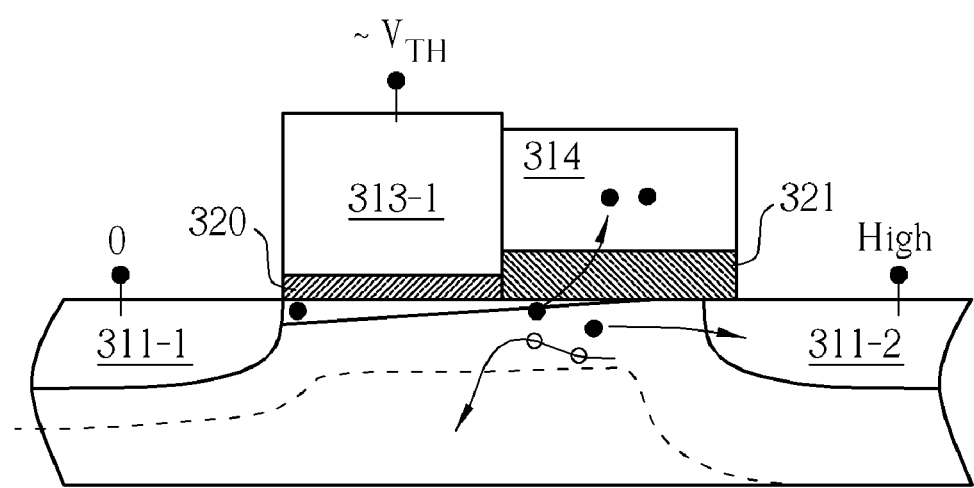
FIG. 4 is a cross-sectional diagram of the CMOS non-volatile memory cell along line 4-4' of FIG. 3 in program mode.
Figure 6:
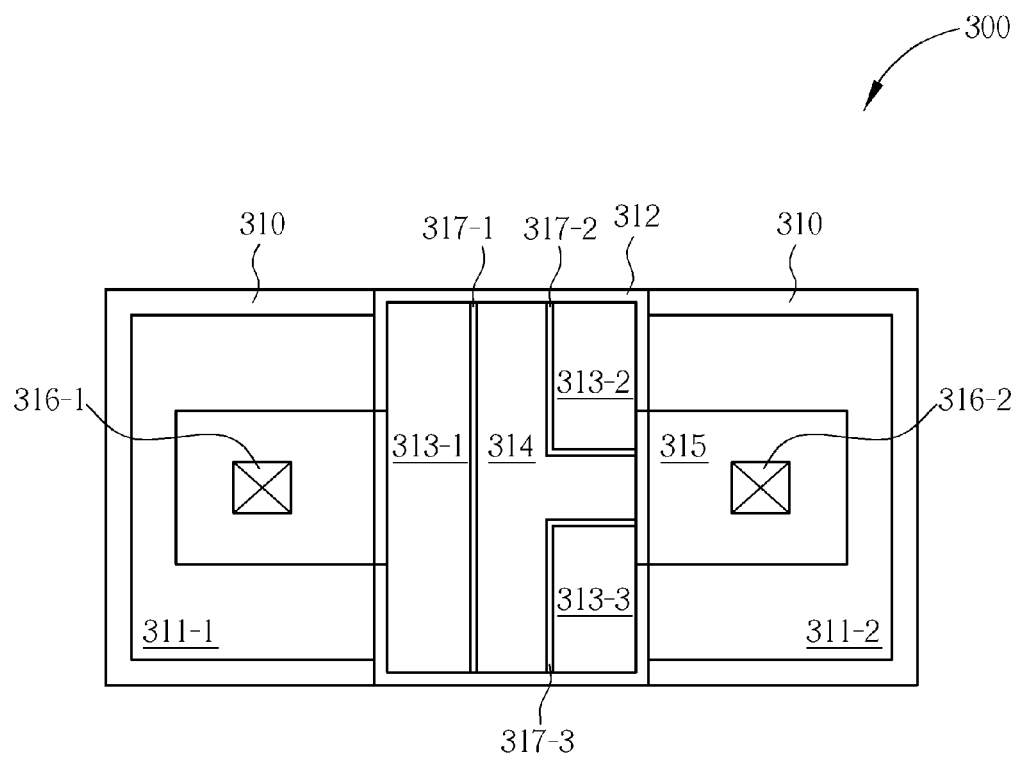
FIG. 6 is a diagram of a complimentary metal-oxide-semiconductor non-volatile memory cell showing sidewall spacers.

Please refer to FIG. 4, which is a cross-sectional diagram of the CMOS non-volatile memory cell 300 along line 4-4' of FIG. 3. FIG. 4 shows the memory cell 300 in program mode. A first oxide layer 320 may be formed between the first polysilicon gate 313-1. In program mode, for an N-type MOSFET, a gate voltage of approximately a threshold voltage $V_{TH}$ of the memory cell 300 may be applied to the polysilicon gate 313-1, a high voltage may be applied to the diffusion region 311-2 ("second diffusion region"), and the diffusion region 311-1 ("first diffusion region") may be grounded. In this way, channel hot electrons may travel from the first diffusion region 311-1 through a channel region formed between the toward the second diffusion region 311-2. Likewise, holes may travel from the second diffusion region 311-2 toward the P-well 310. The channel hot electrons may be injected into the SAN layer 314 through a second oxide layer 321 formed between the SAN layer 314 and the substrate. Addition of the second and third polysilicon gates 313-2, 313-3 may couple high voltage to sidewall spacers 317-1, 317-2, 317-3 (see FIG. 6) adjacent the SAN layer 314, which may greatly enhance channel hot electron injection efficiency. The sidewall spacers 317-1, 317-2, 317-3 may be formed of oxide grown on the substrate and the second and third polysilicon gates 313-2, 313-3. Further, peak channel hot electron injection may be shifted to an edge of the second diffusion region 311-2 under the SAN layer 314, and current density may be enhanced by applying voltage to the second and third polysilicon gates 313-2, 313-3.

Figure 5:
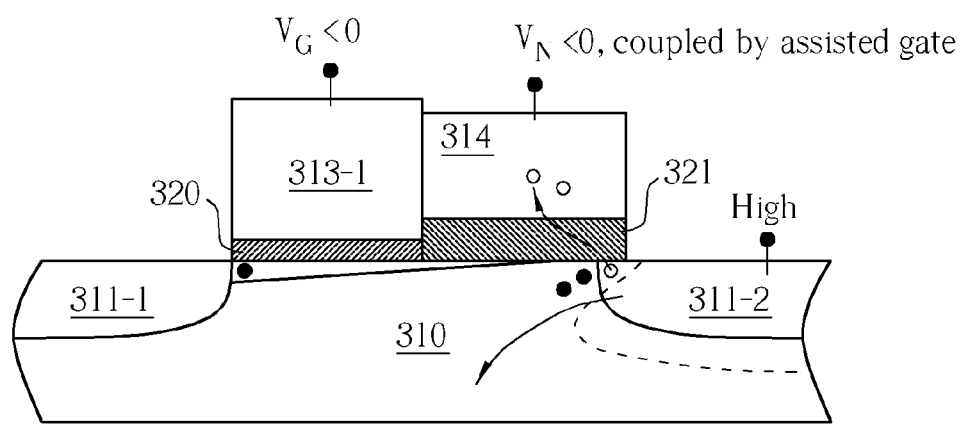
FIG. 5 is a diagram of the CMOS non-volatile memory cell of FIG. 4 in erase mode.

Please refer to FIG. 5, which is a diagram of the CMOS non-volatile memory cell 300 of FIG. 4 in erase mode. Band-to-band tunneling hot hole (BBHH) injection may be utilized to erase the memory cell 300. As shown in FIG. 5, a low voltage, e.g. <0 Volts, may be applied to the first polysilicon gate 313-1, and a SAN layer voltage VN, e.g. <0 Volts, may be coupled to the sidewall spacers 317-1, 317-2, 317-3 next to the SAN layer 314 by the second and third polysilicon gates 313-2, 313-3. A high voltage may be applied to the second diffusion region 311-2. In this way, BBHH injection may occur, such that hot holes may travel from the second diffusion region 311-2 to the SAN layer 314 through the oxide layer 321. Likewise, electrons may travel toward the P-well 310 due to the low voltage coupled through the sidewall spacers 317-1, 317-2, 317-3 by the second and third polysilicon gates 313-2, 313-3. Thus, hot hole injection current may be enhanced due to an external vertical electric field in the sidewall spacers 317-1, 317-2, 317-3 induced through the second and third polysilicon gates 313-2, 313-3.

Thus, it can be seen that through addition of the second and third polysilicon gates 313-2, 313-3, the memory cell 300 has enhanced current density in both program and erase modes, which improves performance of the memory cell 300 over the prior art. Further, in simulation, the memory cell 300 exhibits an acceptable program/erase window under 2 Volts operation.

Figure 7:
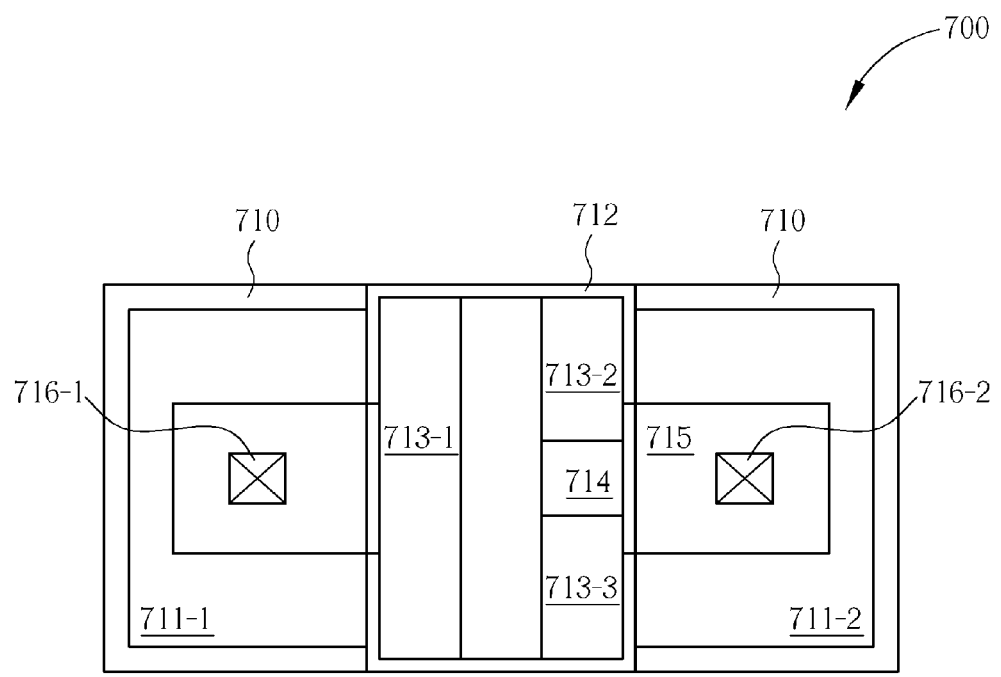
FIG. 7 is a diagram of a complimentary metal-oxide-semiconductor non-volatile memory cell according to another embodiment of the present invention.

Please refer to FIG. 7, which is a diagram of a complimentary metal-oxide-semiconductor non-volatile memory cell 700 (hereinafter "the memory cell 700") according to another embodiment of the present invention. The memory cell 700 may be formed over an active region 715 in a P-well region 710 of a substrate. A first N+ diffusion region 711-1 may be formed under a first polysilicon gate 713-1, and a second N+ diffusion region may be formed under a second polysilicon gate 713-2 and a third polysilicon gate 713-3.

The second polysilicon gate 713-2 and the third polysilicon gate 713-3 may be formed a first distance apart from each other. Further, the second polysilicon gate 713-2 and the third polysilicon gate 713-3 may both be formed a second distance apart from the first polysilicon gate 713-1. The second distance and the first distance may be measured along perpendicular axes. The first polysilicon gate 713-1 may be wider than the second and third polysilicon gates 713-2, 713-3. The first distance may be of a size suitable for forming a self-aligning nitride (SAN) layer 714 in a space between the second and third polysilicon gates 713-2, 713-3, and the second distance may be of a size suitable for not forming an SAN layer between the first polysilicon gate 713-1 and the second and third polysilicon gates 713-2, 713-3. For example, in a 90 nm/65 nm node, a range of 20 nm to 200 nm of separation between the second and third polysilicon gates 713-2, 713-3 may allow formation of a charge storage layer 714, e.g. the SAN layer, in the space between the second and third polysilicon gates 713-2, 713-3. Contacts 716-1 and 716-2 may be formed in the active region 715 over the diffusion regions 711-1 and 711-2, respectively, for charging the diffusion regions 711-1, 711-2 with voltage signals applied to the contacts 716-1, 716-2.

Figure 8:
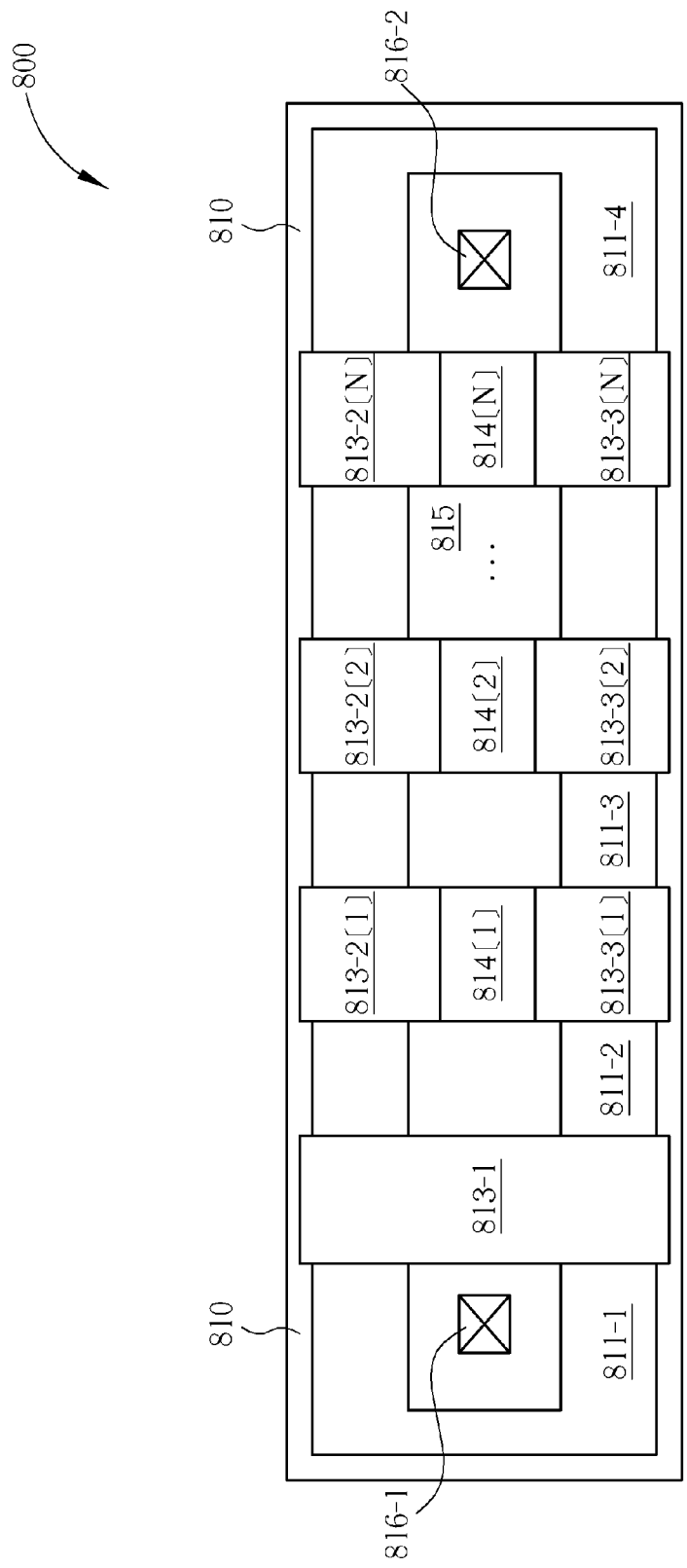
FIG. 8 is a diagram of an array of complimentary metal-oxide-semiconductor non-volatile memory cells according to an embodiment of the present invention.

Please refer to FIG. 8, which is a diagram of an array 800 of complimentary metal-oxide-semiconductor non-volatile memory cells according to an embodiment of the present invention. The array of memory cells 800 may be considered a logical NAND type array comprising a plurality of memory cells in a memory string. Each memory string may comprise a plurality of memory cells as shown in FIG. 8. The memory cells 800 may be formed over an active region 815 in a P-well region 810 of a substrate. As shown in FIG. 8, a total number N memory cells may be formed. A first N+ diffusion region 811-1 may be formed under a first polysilicon gate 813-1. A second N+ diffusion region 811-2 may be formed under the first polysilicon gate 813-1 and second and third polysilicon gates 813-2 [1], 813-3 [1]. A third N+ diffusion region 811-3 may be formed under the second and third polysilicon gates 813-2 [1], 813-3 [1] and under fourth and fifth polysilicon gates 813-2 [2], 813-3 [2]. A fourth N+ diffusion region 811-4 may be formed under sixth and seventh polysilicon gates 813-2 [N], 813-3 [N]. To form a continuous channel between the first N+ diffusion region 811-1 and the fourth N+ diffusion region 811-4, each charge storage layer 814 [1], 814 [2], ..., 814 [N] may store charges, e.g. electrons. If one or more of the charge storage layers 814 [1], 814 [2], ..., 814 [N] does not store charges, current may not pass from the first N+ diffusion region 811-1 to the fourth N+ diffusion region 811-4. Thus, NAND-type operation may be achieved through use of the architecture shown in FIG. 8.

The second polysilicon gate 813-2 [1] and the third polysilicon gate 813-3 [1] may be formed a first distance apart from each other. Further, the second polysilicon gate 813-2 [1] and the third polysilicon gate 813-3 [1] may both be formed a second distance apart from the first polysilicon gate 813-1. The fourth polysilicon gate 813-2 [2] and the fifth polysilicon gate 813-3 [2] may be formed the first distance apart from each other. The fourth polysilicon gate 813-2 [2] may be formed a third distance apart from the second polysilicon gate 813-2 [1]. The fifth polysilicon gate 813-3 [2] may be formed the third distance apart from the third polysilicon gate 813-3 [1]. The third distance may be the same as the second distance. The first distance may be of a size suitable for forming the self-aligning nitride (SAN) layers 814 [1], 814 [2], . . . , 814 [N] in spaces between the second and third polysilicon gates 813-2 [1], 813-3 [1], fourth and fifth polysilicon gates 813-2 [2], 813-3 [2], through the sixth and seventh polysilicon gates 813-2 [N], 813-3 [N]. The second distance may be of a size suitable for not forming an SAN layer between the first polysilicon gate 813-1 and the second and third polysilicon gates 813-2 [1], 813-3 [1]. The third distance may be of a size suitable for not forming an SAN layer between the second and third polysilicon gates 813-1 [1], 813-3 [1] and the fourth and fifth polysilicon gates 813-2 [2], 813-3 [2], respectively. For example, in a 90 nm/65 nm node, a range of 20 nm to 200 nm of separation between the second and third polysilicon gates 813-2 [1], 813-3 [1] may allow formation of a charge storage layer 814 [1], e.g. the SAN layer, in the space between the second and third polysilicon gates 813-2 [1], 813-3 [1]. Contacts 816-1 and 816-2 may be formed in the active region 815 over the diffusion regions 811-1 and 811-4, respectively, for charging the diffusion regions 811-1, 811-4 with voltage signals applied to the contacts 816-1, 816-2.

The above description of FIG. 8 relates to a NAND-type array configuration. A NOR-type array configuration is also described herein as follows. A NOR-type array may comprise a plurality of memory cells, each configured as the memory cell 300 or the memory cell 700. Taking the memory cell 700 as an example, each first diffusion region 711-1 may be electrically connected to other first diffusion regions 711-1 of other memory cells of the NOR-type array, and each second diffusion region 711-2 may be electrically connected to other second diffusion regions 711-2 of the other memory cells of the NOR-type array. In such a configuration, if one or more charge storage layers 714 corresponding to one or more memory cells of the NOR-type array is charged, forming one or more channels from the first diffusion region 711-1 to the second diffusion region 711-2 of the one or more memory cells, current may travel through the channel from the first diffusion region 711-1 to the second diffusion region 711-2. Thus, logical NOR-type operation may be accomplished in the NOR-type array.

Thus, it can be seen that the memory cell 700 has enhanced current density through the SAN layer 714, which improves performance of the memory cell 700 over the prior art. Likewise, the array of memory cells 800 and the NOR-type array benefit from the SAN layers described above in a similar manner.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory string comprising:
   a substrate of a first conductivity type comprising an active region;
   a select gate formed fully on the active region;
   a first diffusion region of a second conductivity type opposite the first conductivity type formed on the surface of the active region on a first side of the select gate; and
   at least one memory unit formed on a second side of the select gate opposite the first side, each memory unit comprising:
   a first gate formed partially on the active region on the second side of the select gate;
   a second gate formed partially on the active region on the second side of the select gate;
   a charge storage layer formed on a surface of the active region filled between the first gate and the second gate;
   a second diffusion region of the second conductivity type formed on the surface of the active region on the first side of the charge storage layer; and
   a third diffusion region of the second conductivity type formed on the surface of the active region on the second side of the charge storage layer;
   wherein a first gate and a second gate of a first memory unit of the at least one memory unit are separated from the select gate by a first distance, and are separated from each other by a second distance in a direction perpendicular to the first distance;
   wherein a first gate and a second gate of each successive memory unit of the at least one memory unit after the first memory unit are separated from a first gate and a second gate of a previous memory unit by the first distance, and the first gate and the second gate of each successive memory unit are separated from each other by a second distance in the direction perpendicular to the first distance;
   wherein a second diffusion region of each successive memory unit of the at least one memory unit is a third diffusion region of the previous memory unit.

2. The non-volatile memory array of claim 1, wherein each charge storage layer of each memory unit further fills between the select gate, the first gate and the second gate of the memory unit.

3. A non-volatile memory array comprising:
   a substrate of a first conductivity type comprising a plurality of active regions; and
   a plurality of memory strings, each memory string of the plurality of memory string comprising:
   a select gate formed fully on one active region of the plurality of active regions;
   a first diffusion region of a second conductivity type opposite the first conductivity type formed on the surface of the active region on a first side of the select gate; and
   at least one memory unit formed on a second side of the select gate opposite the first side, each memory unit comprising:
   a first gate formed partially on the active region on the second side of the select gate;
   a second gate formed partially on the active region on the second side of the select gate;
   a charge storage layer formed on a surface of the active region filled between the first gate and the second gate;
   a second diffusion region of the second conductivity type formed on the surface of the active region on the first side of the charge storage layer; and
   a third diffusion region of the second conductivity type formed on the surface of the active region on the second side of the charge storage layer;
   wherein a first gate and a second gate of a first memory unit of the at least one memory unit are separated from the select gate by a first distance, and are separated from each other by a second distance in a direction perpendicular to the first distance;

wherein a first gate and a second gate of each successive memory unit of the at least one memory unit after the first memory unit are separated from a first gate and a second gate of a previous memory unit by the first distance, and the first gate and the second gate of each successive memory unit are separated from each other by a second distance in the direction perpendicular to the first distance;

wherein a second diffusion region of each successive memory unit of the at least one memory unit is a third diffusion region of the previous memory unit.

4. The non-volatile memory array of claim 3, wherein each charge storage layer of each memory unit further fills between the select gate, the first gate and the second gate of the memory unit.

5. A non-volatile memory array comprising:
a substrate of a first conductivity type;
a plurality of active regions on the substrate; and
a plurality of memory cells, each memory cell formed on one active region of the plurality of active regions, each memory cell comprising:
a select gate formed fully on the one active region;
a first gate formed partially on the active region on a first side of the select gate, wherein the select gate and the first gate are separated by a first distance;
a second gate formed partially on the one active region on the first side of the select gate, wherein the second gate and the select gate are separated by the first distance, and the first gate and the second gate are separated by a second distance;
a charge storage layer formed between the first gate and the second gate;
a first diffusion region of a second conductivity type opposite the first conductivity type formed on the surface of the active region, wherein the first diffusion region and the second gate are formed on opposite sides of the select gate;
a second diffusion region of the second conductivity type formed on the surface of the active region, wherein the second diffusion region and the select gate are formed on opposite sides of the first gate; and
a third diffusion region of the second conductivity type formed on the surface of the active region between the select gate and the first gate, the charge storage layer, and the second gate;
wherein first diffusion regions of the plurality of memory cells are electrically connected to each other, and second diffusion regions of the plurality of memory cells are electrically connected to each other.

6. The non-volatile memory array of claim 5, wherein each charge storage layer of each memory unit further fills between the select gate, the first gate and the second gate of the memory unit.

* * * * *